United States Patent [19]
Arnold et al.

[11] Patent Number: 4,564,944
[45] Date of Patent: Jan. 14, 1986

[54] ERROR CORRECTING SCHEME

[75] Inventors: Richard F. Arnold, Palo Alto, Calif.; John Cocke, Bedford, N.Y.; Don Coppersmith, Ossining, N.Y.; Adrian E. Seigler; Gary E. Strait, both of Poughkeepsie, N.Y.

[73] Assignee: International Business Machines Corporation, Armonk, N.Y.

[21] Appl. No.: 567,212

[22] Filed: Dec. 30, 1983

[51] Int. Cl.⁴ ............................................. G06F 11/10
[52] U.S. Cl. ......................................... 371/37; 364/200
[58] Field of Search .................... 371/37, 38, 39, 40, 371/43; 364/200, 900

[56] References Cited

U.S. PATENT DOCUMENTS

| 4,168,486 | 9/1979 | Legory | 371/37 |
| 4,215,402 | 7/1980 | Mitchell et al. | 364/200 |
| 4,397,022 | 8/1983 | Weng et al. | 371/37 |

OTHER PUBLICATIONS

Hamming, Coding and Information Theory, Prentice Hall, Inc., 1980, pp. 94-96.

Primary Examiner—Charles E. Atkinson
Attorney, Agent, or Firm—George E. Clark; Thomas P. Dowd

[57] ABSTRACT

A method and an apparatus are disclosed for converting error syndromes of an error-correcting code to pointers which identify the positions of the erroneous bits. Each syndrome is converted by a plurality of hashing functions into a plurality of hash words, which in turn are used to address a plurality of read-only stores. The outputs of the read-only stores are logically combined to obtain the respective error pointer. A preferred embodiment uses three hashing functions (41, 43, 45) and three read-only stores (53, 55, 57) and combines their outputs by an Exclusive-Or function (59). The storage capacity and the processing time required for syndrome-to-error pointer conversion are reduced by the disclosed scheme.

13 Claims, 7 Drawing Figures

FIG. 2

ERROR POINTER FORMATS

| ERROR TYPE | 1 | 2 | 3 | 4 | 5 | 6 | 7 | 8 | 9 | 10 | 11 | 12 | 13 | 14 | 15 | NO. OF ERROR BITS | NO. COMBINATIONS (DIFFERENT PATTERNS) |
|---|---|---|---|---|---|---|---|---|---|---|---|---|---|---|---|---|---|
| (a) 2 DATA BITS | 1 | 2 | 3 | 4 | 5 | 6 | 7 | 8 | 9 | 10 | 11 | 12 | 13 | 14 | 15 | 2 | 8128 |
| (b) 1 DATA, 1 ECC BIT | 0 | 1 | 1 | ARBITRARY | | p1 | | 0 | | | d2 | | | | | 2 | 2048 |
| (c) 1 DATA BIT | 0 | 1 | 0 | ARBITRARY | | p1 | | 0 | | | d2 | | | | | 1 | 128 |
| (d) 2 ECC BITS | 0 | 0 | 1 | | p1 | | | 0 | 1 | | | p2 | | 0 | 0 | 2 | 120 |
| (e) 1 ECC BIT | 0 | 0 | 1 | | p1 | | | 0 | 0 | | ARBITRARY | | | 0 | 0 | 1 | 16 |
| (f) NO ERRORS | 0 | 0 | 0 | ARBITRARY | | | | 0 | 0 | | ARBITRARY | | | 0 | 0 | 0 | 1 |
| (g) 3/4 BITS, ONE CARD | 0 | 0 | 0 | | CARD ID | | | 1 | 0 | | 4 BIT MASK | | | 0 | 0 | 3/4 | 180 |
| (h) SPECIAL SYNDROME | 0 | 0 | 0 | 0 | 0 | 0 | 0 | 0 | 0 | 0 | 0 | 0 | 0 | 0 | 1 | 0 | 1 |
| | | | | | | | | | | | | | | | | | 10622 |

16TH BIT USED FOR PARITY CHECK

FIG. 4

FIRST HASHING FUNCTION

A1 = S04 S05 S06 S07 S08 S09 S10 S12 S11 S13 S14 S15
A2 = S08 S09 S10 S12 S11 S13 S14 S15 S00 S01 S02 S03
A2 = S00 S01 S02 S03 S04 S05 S06 S07 S08 S09 S10 S12

HF1 = (A1 or A2) XOR A3

SECOND HASHING FUNCTION

B2 = S01 S02 S13 S14 S15 S03 S04 S05 S09 S10 S12 S11
B2 = S15 S03 S04 S05 S09 S10 S12 S11 S06 S07 S08 S00
B3 = S05 S09 S10 S12 S11 S06 S07 S08 S00 S01 S02 S13
B4 = S06 S07 S08 S00 S01 S02 S13 S14 S15 S03 S04 S05

HF2 = (B1 AND B2) OR B3) XOR B4

THIRD HASHING FUNCTION

C2 = S05 S09 S14 S15 S03 S10 S12 S11 S00 S01 S02 S13
C2 = S03 S10 S12 S11 S00 S01 S02 S13 S06 S07 S08 S04
C3 = S11 S00 S01 S02 S13 S06 S07 S08 S04 S05 S09 S14
C4 = S06 S07 S08 S04 S05 S09 S14 S15 S03 S10 S12 S11

HF3 = (C1 OR C2) AND C3) XOR C4

ERROR CORRECTING SCHEME

FIELD OF INVENTION

Present invention is concerned with a method and an arrangement for error detection and correction. In particular, it is concerned with a double-error correcting scheme and more specifically, with an error correcting scheme employing syndromes for error identification.

More generally, the novel technique covered by this invention is concerned with converting input words, i.e. syndromes of a given length, belonging to a selected but randomly distributed subset of the whole set of input words, to output words which are associated in a unique but arbitrary manner, with optimum storage utilization and minimum time requirements for conversion operations.

BACKGROUND OF THE INVENTION AND PRIOR ART

For enabling the detection or even correction of errors which occured during transmission or storage of data, it is usual to introduce redundancy by appending some check bits to the mere data bits. These extra bits can be either simple parity bits, e.g. one for each of a number of data sub-fields, or they can be a group of interrelated ECC (Error Checking and Correction) bits which are generated by an elaborated procedure. Such procedures include use of an H-matrix or division by a generator polynomial.

In many error correcting schemes, a syndrome is generated on the receiving side which indicates whether or what errors occured. The syndrome can be obtained e.g. by generating from the data portion of the stored or transmitted block an ECC field in the same way as the original ECC field was generated, and then combining the two (received and locally generated) ECC fields e.g. by an XOR operation. If both ECC fields were equal, the syndrome will be all zeros indicating that no error occured. Otherwise, a particular syndrome pattern will be obtained for each different error situation. However, in most ECC schemes the syndrome—though it uniquely identifies at least the correctable errors—does not directly show the position of the erroneous bits but must be first converted to obtain an error pointer, i.e. a direct or simply coded error position address.

The design and utilization of error checking and correcting codes, and the generation and use of syndromes in an error correction process are generally described and reviewed in a book by W. W. Peterson et al. entitled "Error Correcting Codes", MIT Press, Cambridge/Mass., 1972.

Numerous specific techniques and codes for error correction using syndromes are known in the art. U.S. Pat. No. 3,685,014 to M. Y. Hsiao et al. is concerned with an "Automatic double error detection and correction device" which generates syndrome bits from check bits and data bits of a binary word. The disclosed process requires several sequential operations to enable a first bit error correction, and further requires the generation of a second syndrome and additional sequential operations to enable correction of a second erroneous bit.

A similar error correction scheme is disclosed in U.S. Pat. No. 4,236,247 to C. E. Sundberg "Apparatus for correcting multiple errors in data words read from a memory". This scheme also requires sequential operations and the generation of a second syndrome if two errors are to be corrected.

In U.S. Pat. No. 4,030,067 to T. H. Howell et al., entitled "Table lookup direct decoder for double-error correcting (DEC) BCH codes using a pair of syndromes" another ECC technique is described. Two syndromes are generated and are then subjected to sequential multiplying and translating (table look-up) operations for generating two error-indicating words which are used for correcting the erroneous bits. The sequential processing operations by which actually equations are solved need a given amount of time which may be too long for certain applications.

U.S. Pat. No. 4,107,652 to J. Tanahashi et al. "Error correcting and controlling system" also discloses error correction apparatus including syndrome generating means. The error bit positions corresponding to respective syndromes are kept in a storage, and syndromes are used as addressing inputs to this storage. This requires a large amount of storage space because for each possible syndrome a respective error pattern (or non-correctable error indicating pattern) is to be stored. If a reduction in storage will be made, flexibility in the format of error pointers (error indicating patterns) is lost, and circuitry used for generating syndromes can no more be simultaneously used for locally generating ECC fields from the data bits. Furthermore, extra circuitry is required for determining the type of error that occured and was corrected.

If of a large set of possible addresses only a randomly distributed subset has corresponding entries in a storage, e.g. when a high-speed buffer or cache holds selected entries of main storage, a technique generally known as "hashing" can be used for converting the given addresses into more suitable ones for the specific storage. A brief general description of hashing is given in the "Encyclopaedia of Computer Science", Editor A. Ralston, Van Nostrand N.Y. 1976 on pages 604–606. U.S. Pat. No. 4,215,402 to G. R. Mitchell, "Hash index table hash generator apparatus", is an example for the use of hashing in virtual storage addressing.

One disadvantage of known hashing techniques is the fact that the same hash word can be generated on the basis of several different input addresses. This can lead to collisions so that at the location addressed by each hash word, a replication of the full address must be stored to determine which one of the several possible full addresses lead to this entry. Furthermore, an escape mechanism must be provided to enable the generation of additional hash words when the basic hash word is "occupied" already, and a corresponding chain search must be made when such entries are to be retrieved.

It is an object of present invention to devise a method and apparatus for error detection and correction based on the generation of syndrome words from received information blocks comprising data bits and ECC bits.

It is another object to devise an error correction technique using less storage space than would usually be required to store error control information for all generated syndromes, but still using a minimum in additional hardware and processing time for converting syndromes into information pointing to correctable errors.

A further object of the invention is an error-correcting mechanism which allows free and flexible selection of formats for the error pointers developed from syndromes.

Another object is to enable the generation of error-type indications simultaneously with the generation of information pointing to or addressing the error bits which are to be corrected.

Still another object is to devise an error correction technique which allows, based on any known DEC-TED code with byte error correction capability, the correction of two randomly located errors and the correction of three or four errors which are located in any compact sub-group of bits.

One other object is to provide a hashing technique for converting input words or names to assigned output words or values, that avoids collision and chain-searching situations but still enables a good storage utilization.

SUMMARY OF THE INVENTION

The invention for achieving the basic ones of above objects is characterized by a multiple hashing function for obtaining addresses of read-only stores or tables, by read-out of auxiliary words with these addresses, and their logical combination, to obtain an error pointer which identifies the location of correctable errors and further identifies the type of error and correction handled.

Advantages of this invention are: the relatively small storage required; fast operation which is important to avoid delays just for error-checking and correction; complete freedom in the design of error pointer formats, i.e. error location code and error identification can be fully adapted to the system design; correction of multiple errors in subgroups (e.g. storage cards) can also easily be accommodated and handled on the basis of this invention. The invention is applicable to all kinds of error correcting codes which allow the generation of syndromes.

The above mentioned and other objects and advantages of the invention will become more evident from the following description of a preferred embodiment which is illustrated in the accompanying drawings.

BRIEF DESCRIPTION OF THE DRAWINGS

FIG. 2 is a table showing the various error pointer formats chosen for present embodiment, which are obtained by the hashing operation, FIG. 3 consisting of FIGS. 3A and 3B is a more detailed block diagram of the arrangement of FIG. 1, showing in particular the hashing technique for obtaining error pointers from syndromes and the decoding of error pointers for the correction operations, FIG. 4 is a table illustrating the hashing functions chosen in present embodiment for converting syndromes into error pointers.

DETAILED DESCRIPTION OF A PREFERRED EMBODIMENT

General Explanation

A basic problem solved by present invention is the conversion of syndromes into error position codes or error pointers.

It is assumed that the ECC code and the procedure for syndrome generation were previously selected, and that at least each of those error patterns which have to be correctable, e.g. single and double error patterns, is uniquely identified by a respective syndrome pattern. It is further assumed that error pointer formats suitable for the respective system or application were selected (e.g. that of FIG. 2 to be explained later).

In this situation, the invention provides: (a) conversion of a given syndrome into H hash words by H hashing functions; (b) addressing of H tables or read-only stores by these H hash words, to obtain H auxiliary words; and (c) combination of the H auxiliary words by a given logical function to obtain a single error pointer word.

For any implementation, first a set of H hashing functions is selected (e.g. those of FIG. 4 to be explained later), and the logical function for combining the auxiliary words is selected, e.g. an Exclusive-or function. On the basis of the parameters now given, i.e. a set of selected syndromes, a set of error pointers assigned to these syndromes, the selected set of hashing functions (which determine the length of generated hashing words used as addresses and thus the size of each of the H ROS units), and the selected logical function a set of linear equations is established which will have as solutions the auxiliary words that have to be stored in the H ROS units to obtain for each of the selected syndromes the required error pointer output.

If a complete solution of the set of equations is not possible on the basis of the given parameters, a revised set of hashing functions must be selected, thus obtaining a new set of linear equations which have to be solved. Only if a complete solution is possible the selected hashing functions are accepted and the respective sets of auxiliary words are stored in the ROS units. Some more details on the interrelation between input words (syndromes), hashing functions, auxiliary words, and output words (error pointers) will be given in a later section in connection with FIG. 5.

The disclosed technique of using multiple hashing functions eliminates collisions (obtaining same output for several unrelated input words) and enables a unique conversion of any of the selected syndromes into an assigned error pointer.

Figure 6:
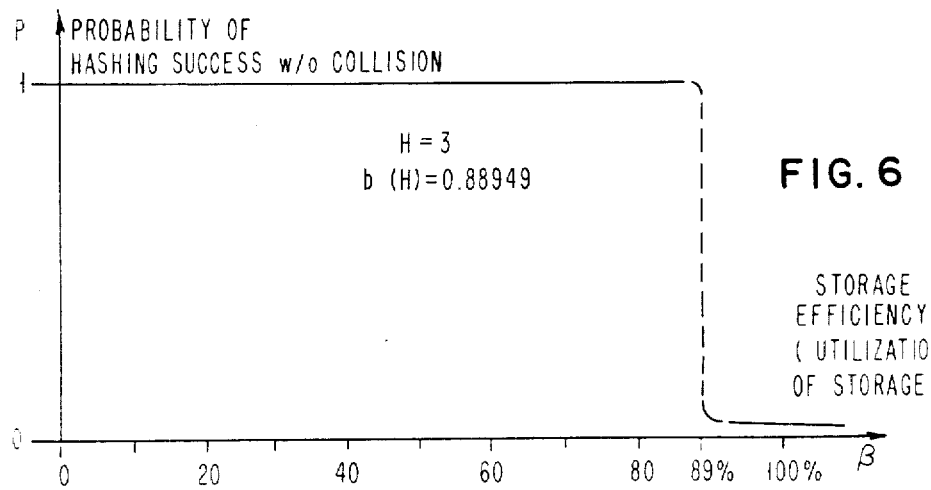
FIG. 6 is a diagram showing the relation between storage utilization and the probability of hashing collisions, and indicating the critical value of storage utilization for a triple hashing function, below which almost certainly no collisions occur.

Though a full (100%) utilization of storage is not possible in a hashing scheme, the use of multiple hashing functions allows a very good utilization (as will be seen later in connection with FIG. 6).

As is evident from the above explanations, the multiple hashing scheme could be used not only for error detection and correction but also for other application areas in which a randomly selected subset of a whole set of input words (or names) must be converted to uniquely assigned output words (or values).

Overview of Error Correcting Arrangement

Figure 1:
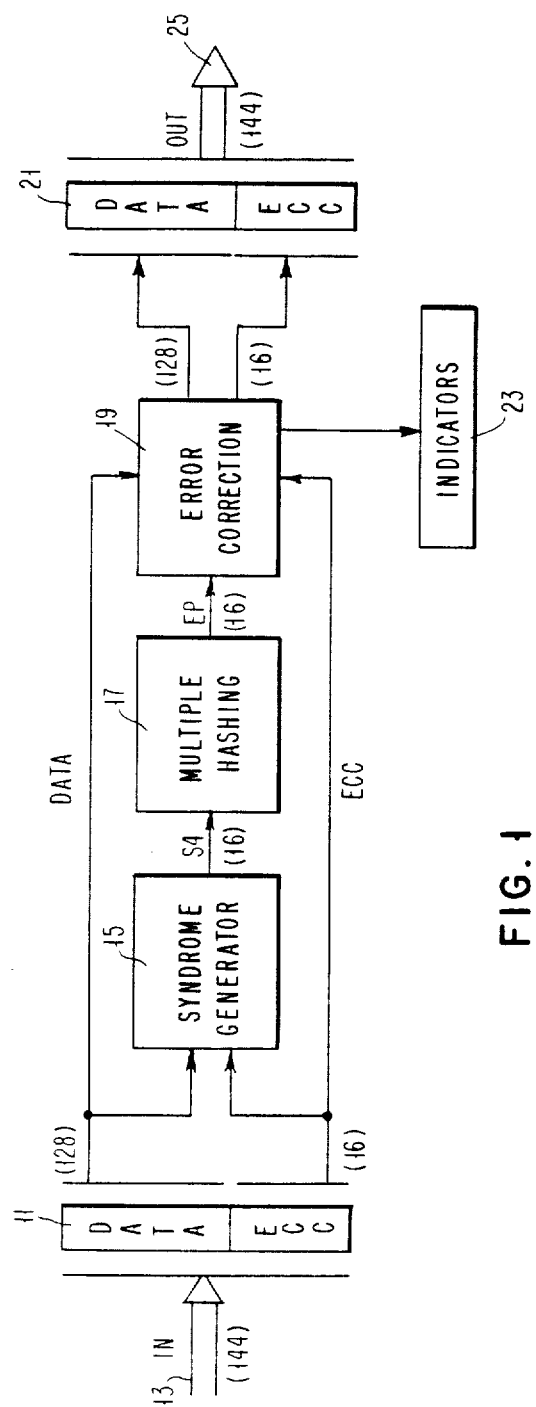
FIG. 1 is a basic block diagram of an error correction arrangement incorporating present invention.

FIG. 1 shows a general overview of an error correction arrangement in which the present invention is employed. The numbers in parenthesis indicate the number of bits which are transferred on the respective line.

An input register 11 receives on an input line 13 blocks of data e.g. from a communications unit (receiver) or from the output of a storage. It has a capacity of 144 bits: 128 bits of data (four 32-bit words) plus 16 bits for error checking and correction (ECC).

The data bits and ECC bits are furnished separately to a syndrome generator 15 which generates from them a syndrome word of 16 bits uniquely representing the errors—if any—that were present in the received data word and which can be recognized on the basis of the ECC bits provided. If no errors occured, the syndrome will be all zeros.

Though the syndrome contains information on whether and what errors are present in the received data words, it does not directly indicate their position and thus must be converted to an error pointer EP which more directly points to the erroneous bits so that they can be corrected. An essential feature of present invention is the provision of the multiple hashing functions for achieving this conversion, as was mentioned already in the previous section. They are implemented in present example by multiple hash means 17 which furnish a 16-bit error pointer. The respective circuitry will be explained in more detail in connection with FIG. 3A/3B. Samples for a set of error pointers will be given in the next section in connection with the tables of FIG. 2.

Error correction means 19 is provided for the actual correction process. It receives the data bits and ECC bits stored in register 11, and the error pointer EP and furnishes a corrected block of 128 data bits and 16 ECC bits to register 21. From there, the 144-bit block is gated to output line 25 which transfers it to a processor, or to communications equipment, or the like. Indicators 23 are provided in connection with error correction means 19 to show whether an error occured and was corrected, or whether an uncorrectable error is present.

Error correction circuitry 19 will also be explained in more detail in connection with FIG. 3A/3B.

The bit numbers shown are typical for many actual applications but can be varied of course to adapt the error correction units to the design of any system.

Error Pointers

In FIG. 2, the formats of error pointers are shown that were selected for present embodiment. Basically, the error pointer should identify the position (bit address) of one or two bits that are in error and must be inverted for correction, and it should indicate whether one or two errors were corrected, and whether data bits or ECC bits were involved.

Each of lines (a) . . . (h) shows one of the possible EP formats. Fifteen bits are shown per line, assuming that the sixteenth bit is used for parity checking of the EPs and thus of the hashing operation. "d1" and "d2" each indicate the address of one bit in the 128-bit data portion and thus each consist of seven bits; "p1" and "p2" each indicate the address of one bit in the 16-bit ECC portion of a block and thus each consist of 4 bits.

Lines (a) . . . (e) give the five possible EP formats for single or double bit errors. The fixed bit values 0 and 1 in each line are used for identifying the respective EP format.

Line (g) is the EP format for a special situation that can also be handled by present error correction scheme, i.e. the occurence of 3 or 4 bit errors on a single card.

Assuming that 36 cards are provided each for four bits, the "CARD ID" of six bits can identify any of the 36 cards, while the "4 BIT MASK" directly indicates which three or four bits on that card are in error and must be inverted.

Line (h) shows the format of an error pointer that is only generated in response to a special syndrome indicating a particular condition in the storage or communications equipment which provided the data block, e.g. if the data originally provided to the storage or communications equipment was known to contain uncorrectable errors or was known to be otherwise unusable, accompanying ECC bits would be applied that would cause the special syndrome to be generated whenever error correction was attempted, thereby indicating the unusability of the data without causing an uncorrectable error indication and without implying the possiblity of a malfunction within the storage or communications equipment providing the data. This error pointer consists of all zeros except for the last two bits which are both one, and causes only a special situation indication at indicators 23 (FIG.1) but not any error correction.

Figure 3A:
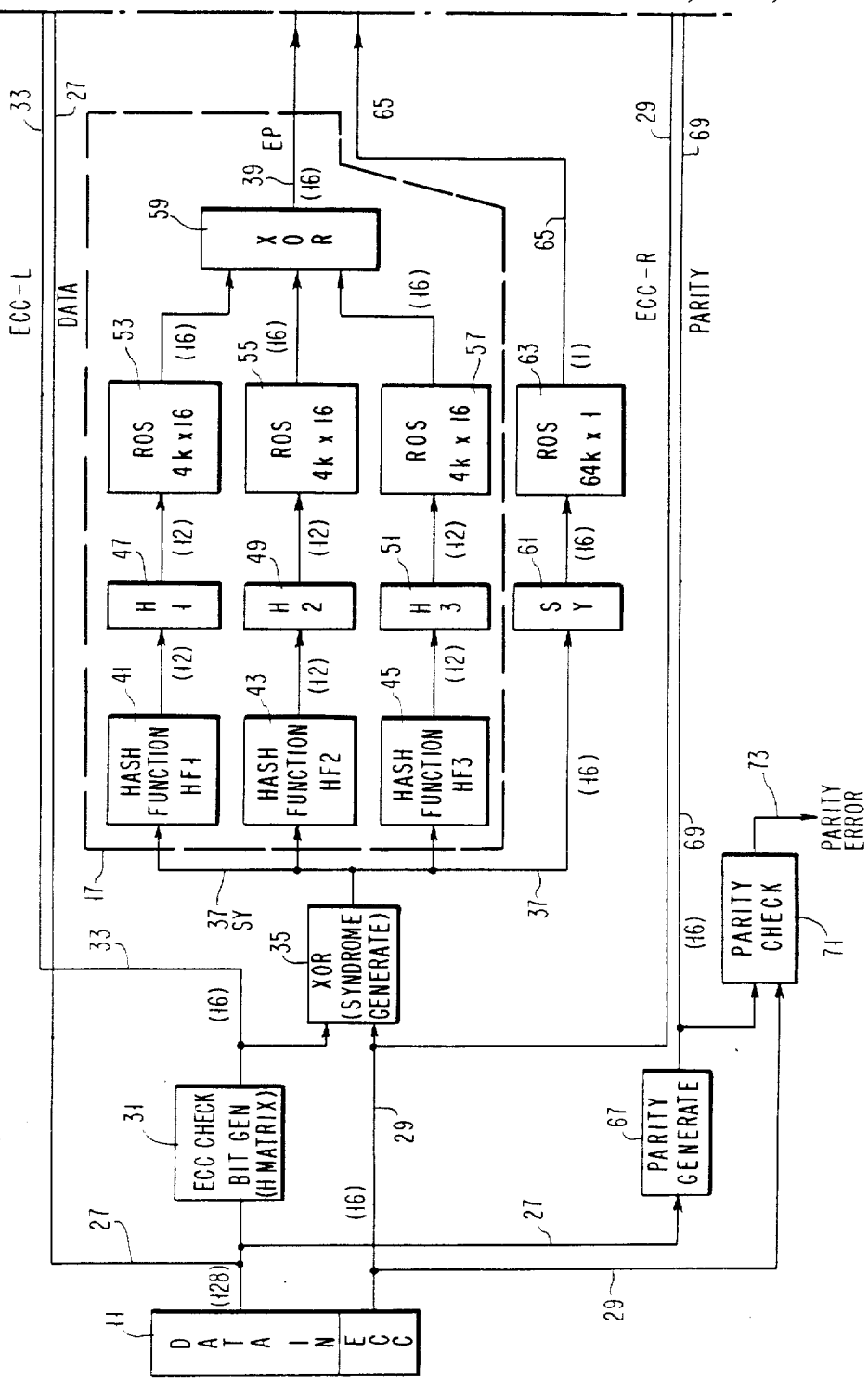

Note that uncorrectable errors will be detected by special circuitry not shown in FIG. 1 (only in FIG. 3A/3B). They do not result in an error pointer EP but cause an indication of the error in indicators 23.

The two extra columns at the right side of FIG. 2 show for each EP line (1) how many bits are identified for correction, and (2) how many different combinations (patterns) of such errors or, equivalently, how many different error pointers are possible for the respective situation. Thus, there are e.g. 8,128 different combinations of two erroneous bits within 128 data bits, or 16 different situations with a single erroneous bit of 16 bits, or 180 possible combinations of either three or four erroneous bits on a single card of 36 4-bit cards.

Altogether, there are 10,622 different situations which can be indicated by a unique error pointer (including the two cases where no error occured and where a special syndrome is generated).

It is to be noted that above error pointer formats or patterns are only one possible solution. An important advantage of present invention is the possibility to select any suitable representation and placement of error position codes and error type indicators within the error pointer, i.e. the format can be freely selected.

Details and Operation of Error Correcting Arrangement

FIG. 3 (separated into FIGS. 3A/3B) shows a more detailed block diagram of the error correcting arrangment that was basically explained with FIG. 1 already. The individual blocks of FIG. 3, their function, interrelation and operation will be explained in the following section.

Input register 11 can hold a block of 144 bits of which 128 data bits are available on data line 27 and 16 ECC bits are available ECC-R line 29 (ECC-R standing for ECC-Received). ECC check bit generator 31 is connected to data line 27 and generates from the 128 input data bits a 16-bit ECC pattern in the same way as the ECC pattern in register 11 was obtained at the source of the data block (e.g. by using an H matrix). The generated ECC pattern is available on ECC-L line 33 (ECC-L standing for ECC-Local).

Both ECC patterns, i.e. ECC-R on line 29 and ECC-L on line 33 are combined by XOR circuitry 35 which generates a 16-bit syndrome SY on line 37. Note that ECC check bit generator 31 and syndrome generation XOR circuitry 35 are shown in FIG. 1 as one syndrome generator 15.

Multiple hash means 17, indicated by a dashed line in FIG. 3A, receives the syndrome SY on line 37 and furnishes error pointer EP on line 39. They comprise the following means:

(a) Three combinatorial logic units 41, 43, 45 which according to given hashing functions HF1, HF2, and HF3 respectively generate from one 16-bit syndrome SY three different 12-bit hash words H1, H2, and H3 respectively. Sample hashing functions will be given in a later section in connection with FIG. 4.

(b) Three registers 47, 49, 51 for receiving the three hash words H1, H2, H3 respectively.

(c) Three read-only stores 53, 55, 57 each containing 4,096 16-bit auxiliary words. Each of the three registers H1, H2, H3 is connected to one of the ROS units so that each hash word can be used as an address to select one of 4,096 auxiliary words. Outputs of the three ROS units 53, 55, 57 are connected to XOR circuitry 59 which combines the three input bits of each of the 16 bit positions separately to generate the single 16-bit error pointer EP on line 39.

As the syndrome consists of 16 bits, $2^{16}$ or 65,536 (64k) different syndromes are possible but only 10,622 of them should result in an error pointer (cf. above text for FIG. 2). For the remaining ones, an "uncorrectable error" indication should be given. For this purpose, a 16-bit syndrome register 61 is provided which addresses a read-only store of 65,536 (64k) one-bit positions. The 10,622 selected syndromes are indicated by a "1"; the other syndromes, which relate to uncorrectable errors are indicated by a "0". Single-bit output line 65 furnishes the respective bit value to the error correcting circuitry shown in FIG. 3B.

In some situations, it is desirable to use the 16 check bit positions of a data block for parity bits (one parity bit for each of 16 data bytes) instead of ECC bits (which are common for the whole data block). For this purpose, a parity generation unit 67 is connected to 128-bit data line 27. It provides the 16 parity bits on output line 69. Parity check circuitry 73 is connected to parity output line 69 and to ECC-R line 29 so that in case register 11 contains parity bits in the ECC section, they will be checked and the parity check result available on output 73 could be used for indicating an error.

Figure 3B:
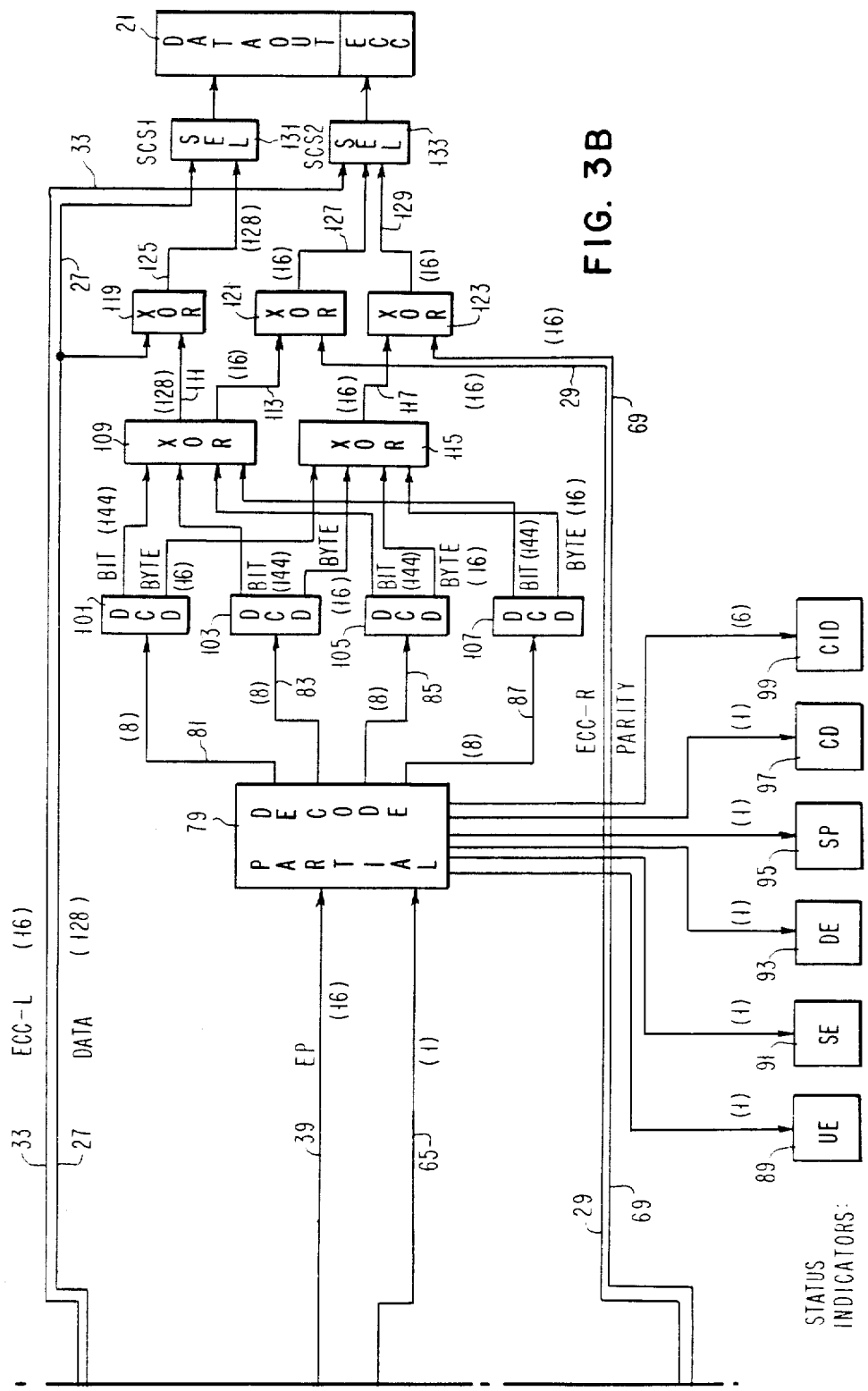

The right-hand part of FIG. 3, i.e. FIG. 3B, shows details of the circuitry actually correcting the erroneous bits, and of the error indicators (designated as blocks 19 and 23 in FIG. 1).

A partial decoder 79 is connected to 16-bit line 39 and to one-bit line 65 to either receive an error pointer EP or an indication that an incorrectable error is present. This partial decoder has four 8-bit outputs 81, 83, 85, 87 for furnishing the position codes of up to four erroneous bits in a block of 144 bits.

With reference to FIG. 2, it will be seen that in case of EP formats (c) or (e), only output 81 receives a position code, while outputs 83, 85, 87 will receive all ones. If EP formats (a), (b), or (d) are present, outputs 81 and 83 both receive a position code while outputs 85 and 87 receive all ones. Only in case of format (g), three or even four of the partial decoder outputs will receive an error bit position code. In this case the first six bits of all three (or four) bit error position codes are equal to the card identifier of the error pointer (FIG. 2, line g), and the last two bits are different on each of the 8-bit outputs 81, 83, 85 (and 87) because they identify the three (or four) particular bits on the respective card that are in error.

Five status indicators 89, 91, 93, 95, and 97 and a card indicator 99 are also connected to outputs of partial decoder 79. With reference to FIG. 2: Indicator 89 is activated in response to an active signal on line 65 (uncorrectable error UE); indicator 91 is activated in response to EP formats (c) and (e)=single error corrected (SE); indicator 93 is activated in response to EP formats (a), (b), and (d)=double error corrected (DE); indicator 95 is activated in response to EP format (h)=special syndrome detected (SP). Finally, indicator 97 is activated in response to EP format (g)=three or four bit card failure corrected (CD), while simultaneously the 6-bit card identification from the error pointer is transferred to card indicator 99 (CID).

It appears that on the basis of above description and with the format table of FIG. 2, any person skilled in the art can design partial decoder 79 easily so that no further details of this decoder need be presented here.

Each of the four 8-bit outputs 81 ... 87 is connected to a final decoder (DCD) 101, 103, 105, 107 respectively. In response to an 8-bit input code, each of these decoders activates one of 144 output lines. If the respective error bit position is located within the 128-bit data portion of the 144-bit block, the respective byte of 16 data bytes is indicated on one of 16 additional output lines (to enable correction of a wrongly generated parity bit). None of the 16 byte lines will be activated if the respective error is located in the ECC portion (bits 129 ... 144).

The 144 output lines of each of the four final decoders DCD are connected to XOR circuitry 109 which on its 144 output lines furnishes a combined error bit identification (i.e. depending on the number of errors to be corrected, none, one, two, three or four of the lines are activated). 128-bit output 111 furnishes the error position identification for the data bits, and 16-bit output 113 furnishes the error position identification for the check bit (ECC/parity) portion.

The 16 output lines of each of the four final decoders DCD are connected to XOR circuitry 115 which on its 16 output lines furnishes a combined identification of the up to four data bytes (of 16 data bytes) in which an error is to be corrected. No line of output 117 is activated if an error is only corrected in the check bit (ECC, parity) portion of the 144-bit block.

For the actual correction, XOR circuits 119, 121, and 123 are provided. XOR circuitry 119 is connected to 128-bit line 27 to receive the uncorrected data bits from register 11, and to error identifying output 111; it corrects, i.e. inverts the identified data bits and furnishes on 128-bit output line 125 a corrected data block. XOR circuitry 121 is connected to 16-bit line 29 to receive the uncorrected ECC bits from register 11, and to error identifying output 113; it corrects, i.e. inverts the identified check bits and furnishes on 16-bit output line 127 a corrected ECC portion. XOR circuitry 123 is connected to 16-bit line 69 to receive the locally generated parity bits from parity generator 67, and to error identifying output 117; it corrects, i.e. inverts the identified parity bits and thus provides on its output 129 16 correct parity bits for each of the 16 data bytes available on output 119.

Finally, selection circuits 131 and 133 are provided to enable selective transfer of data and check bits to output register 21. Selection circuitry 131 either gates the uncorrected data bits from line 27 and register 11, or the corrected data bits from output 119 to the 128-bit data portion of register 21 (depending on select control signal SCS1). Selection circuitry 133 either gates the locally generated ECC-L bits from line 33 and ECC check bit generator 31, or the corrected received ECC-R bits from output 127, or the corrected locally generated partity bits from output 129, to the 16-bit ECC portion of register 21 (depending on select control signal SCS2).

The correction portion shown in FIG. 3B which receives the error pointer on line 39 and furnishes the corrected output block can of course be differently implemented, but the arrangement described above is a preferred one.

Selection of and Example for Hashing Functions

As was explained previously, the three hashing functions HF1, HF2 and HF3 can be arbitrarily selected. Using the resulting hashing function values for each selected or allowed syndrome (each syndrome identifying correctable errors) as input and the respective error pointers (having formats of FIG. 2) as output, one has a set of linear equations which are then solved to determine contents of the three read-only stores (53, 55, 57 in FIG. 3A). One starts with a tentative set of hashing functions, and if a complete solution of the set of linear equations is not possible, another set of hashing functions must be tried until a solution is possible.

One possible set of three hashing functions HF1, HF2 and HF3 is shown in FIG. 4. For each hashing function, three (or four) vectors are obtained by rearranging the sixteen syndrome bits S00 ... S15 as shown, e.g. for A1. The three (or four) bit vectors are then logically combined (each bit position separately) as shown in FIG. 4 to obtain the actual hashing function value which is a 12-bit vector. E.g., for the first hashing function HF1, three vectors A1, A2 and A3 are generated using the syndrome bits, and then A1 and A2 are logically combined (bitwise) by an OR function, and the result is logically combined (bitwise) by an EXCLUSIVE-OR function with A3.

The three hashing functions can be easily implemented by combinatorial logic circuitry on the basis of the relations shown in FIG. 4 (or any other set of hashing functions that was selected). Each of the hashing circuit means has 16 inputs for the 16 syndrome bits S00 ... S15, and 12 outputs for the 12-bit hash word H1, H2, or H3 respectively.

Theoretical Background for Multiple Hashing Process

In the following section, some theoretical background is given for the multiple hashing process, in connection with FIGS. 5 and 6. As the process is not only applicable to error correcting, the more general terms "names" for input words and "values" for output words are used instead of "syndromes" and "error pointers", respectively.

Figure 5:
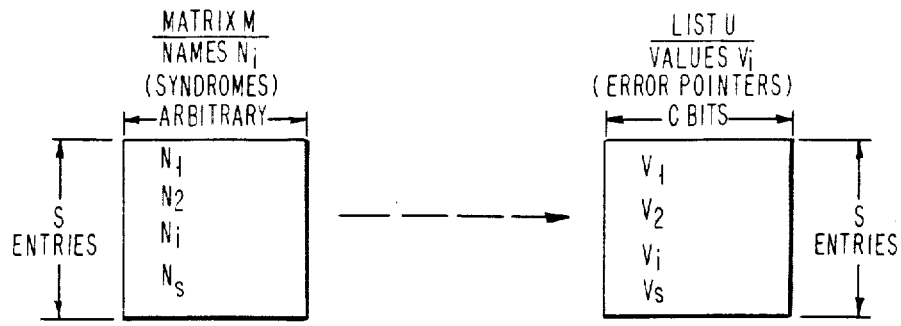
FIG. 5 is a schematic illustration of the multiple hashing process of present invention.
Figure 5:
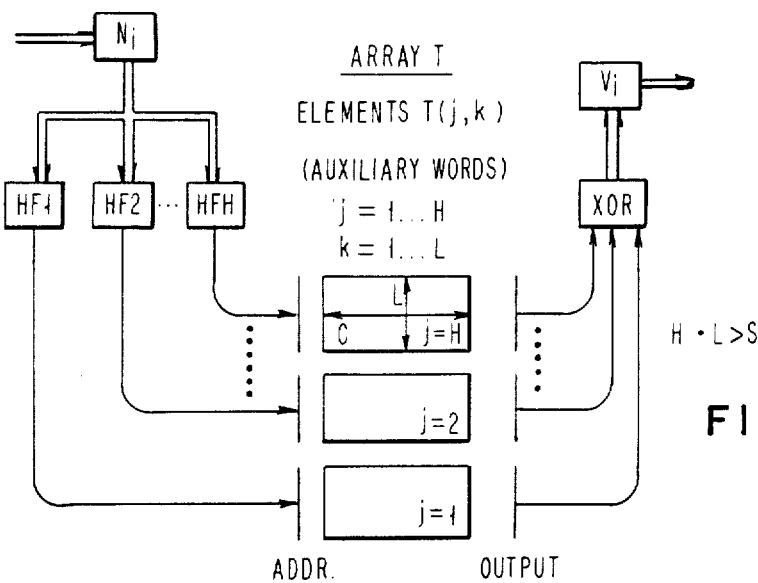

On the top of FIG. 5, there is shown a static list of "name-value" pairs, i.e. S names $N_1 \ldots N_S$ which are uniquely associated to S values $V_1 \ldots V_S$. The proposed multiple hashing scheme is applicable to any such static list of name-value pairs. It allows to take an arbitrary name from the list and produce its associated value with little computation. It is especially useful when the names are relatively long and the values are relatively short.

The chief advantage of this scheme is its predictability: the amount of time required to associate a value with any name is a small fixed quantity, independent of the name. This is opposed to the traditional hashing schemes, which resolve hashing conflicts by a potentially lengthy chain-searching algorithm. The present scheme is more readily applicable to PROMs or PLAs than the conventional schemes.

Another advantage of this scheme is the storage requirements: it needs only a little more storage space than would be required to store merely the list of values. Thus if the "names" are long, and the "values" are relatively short, the savings come from the fact that it is not necessary to store the "names" at all, and the storage is nearly that involved in storing the values alone.

Suppose one wishes to store a static list of S elements, with "names" $N_i$ of arbitrary length, and "values" $V_i$ of C bits each, i=1, 2, ..., S. Integers $H \geq 3$ and L are chosen, such that HL>S. (H being the number of hashing functions, L being the number of possible values for each hashing function). One allocates H blocks of storage each containing L words of C bits each. During preprocessing (described below), this storage of HL words is filled up with appropriate elements (auxiliary words), say T(j,k), j=1,2, ... H; k=1, ... ,L (see FIG. 5).

There are H different hashing functions, $HF_1, HF_2, \ldots HF_H$, each of which maps the space of "names" to the integers 1 through L. It is assumed that these hash functions are sufficiently independent and random. To retrieve a value $V_i$, one applies each of the hashing functions $HF_j$ to the given name $N_i$. The corresponding elements T(j, $HF_j(N_i)$) are looked up in the storage blocks. Then all these elements are combined by EXCLUSIVE-OR (i.e. addition modulo 2). The result will be the associated value $V_i$.

Note that the value $V_i$ was obtained directly. A traditional hashing scheme would have to check the original name $N_i$ against its hash table, and in case of conflict (two names hashing to the same place in the table), would have to now invoke a chain searching scheme, which takes an unpredictable amount of time. The new scheme avoids this unpredictability altogether by eliminating the conflicts.

Given the values S and C, the name-value pairs ($N_i, V_i$), the values H and L, and the hash functions $HF_j$, how is the table T(j,k) formed? The question is whether such a table T(j,k) can exist on which the hashing scheme will work properly.

Let U be the original list of values $V_1, V_2, \ldots V_S$, so that U is an S×C array of bits. View T as an HL×C array of bits. The hashing functions $HF_1$ through $HF_H$, together with the list of names $N_1, N_2, \ldots, N_S$, can be represented by an S×HL matrix M, where $M_{i,(j-1)L+k}=1$ if $HF_j(N_i)=k$, and 0 otherwise. Each row in M has sum H. The statement that the retrieval mechanism works, is equivalent to the matrix equation U=MT with the arithmetic being done modulo 2 (in GF(2)).

Thus the problem, during preprocessing, is to create a suitable T, given U and M. This will be possible if the rows of M are linearly independent (over GF(2)). As a preliminary step, before estimating the probability that the rows of M are linearly independent, we analyze a related problem. Let P(L,N) be the probability that N balls, distributed independently and uniformly among L bins, will land in such a way that each bin contains an even number of balls.

$$P(L,N) =$$

$$\sum_{2/n \leq N} \binom{N}{n} \left(\frac{1}{L}\right)^n \left(\frac{L-1}{L}\right)^{N-n} P(L-1, N-n).$$

and the initial conditions $$P(1,N) = \begin{matrix} 1 \\ 0 \end{matrix} \text{ if } N \text{ is } \begin{matrix} \text{even} \\ \text{odd} \end{matrix}.$$

This recurrence relation is solved to find $$P(L,N) = \frac{1}{2^L L^N} \sum_{p=0}^{L} \binom{L}{p} (L-2p)^N.$$

For k a positive even integer, given a set of k distinct indices $a_i$ between 1 and S, the probability that the corresponding rows of M ($M_{a_i,*}$) sum to zero (over GF(2)) is equal to the quantity $P(L,K)^H$. If k is odd, the probability is 0, since $P(L,k)$ is 0 for k odd.

Now one can estimate the probability that, among the S rows of M, there is some linear dependence. This is bounded by the sum of the probabilities that any given non-empty subset of rows sums to zero over GF(2). This sum is, in turn, represented as $$\sum_{k=1}^{S} \binom{S}{k} P(L,k)^H$$

$$= \sum_{k=1}^{S} \binom{S}{k} \frac{1}{2^{LH} L^{kH}} \left( \sum_{p=0}^{L} \binom{L}{p} (L-2p)^k \right)^H$$

$$= \sum_{k=0}^{S} \binom{S}{k} \frac{1}{2^{LH}} \sum_{p_i=0}^{L} \pi \left[ \binom{L}{p_i} \left( \frac{L-2p_i}{L} \right)^k \right] - 1$$

$$= \sum_{p_i} \frac{1}{2^{LH}} \left[ \pi \binom{L}{p_i} \right] \sum_{k=0}^{S} \binom{S}{k} \left( \pi \frac{L-2p_i}{L} \right)^k - 1$$

$$= \sum_{p_i} \frac{1}{2^{LH}} \left[ \pi \binom{L}{p_i} \right] \left[ 1 + \pi \left( \frac{L-2p_i}{L} \right) \right]^S - 1$$

The summand generally has two local maxima (as $p_i$ vary while L, H, and S are fixed).

One local maximum occurs at $p_i = L/2$. Calculate the contribution of nearby terms to the sum. Make the approximation that $p_i - L/2 = O(\sqrt{L})$. Then the contribution is roughly $$= \frac{1}{2^{LH}} \sum_{p_i} \left[ \pi_i \binom{L}{p_i} \right] \left[ 1 + S \pi_i \left( \frac{L-2p_i}{L} \right) + \frac{S^2}{2} \pi_i \left( \frac{L-2p_i}{L} \right)^2 + \ldots \right].$$

The sum "1" sums to 1. The next term sums to zero, as the term for $(p_1, p_2, \ldots, p_H)$ is cancelled by the corresponding term for $(L-p_1, p_2 \ldots, p_H)$. The next term sums to $S^2/2L^H$. This term corresponds to the possibility that two rows will be equal (and their sum will be zero). For $H \geq 3$, this term is small, while for $H=2$ it is of order 1. The lower order terms may be ignored.

The second local maximum occurs where all the $p_i$ are equal to some value of p strictly less than $L/2$. Here an interesting phenomenon occurs. Introduce a number $\beta$ such that $S = LH\beta$. (Then $\beta$ measures the storage efficiency of the scheme; $\beta = 1$ would be perfect efficiency.) Then to first order, the contribution of terms near this second peak behaves like an exponential: $e^{Lf(H,\beta) + o(L)}$. For each value of $H \geq 3$, there is a critical value b(H), such that for $\beta > b(H)$, $f(H,\beta) > 0$, and for $\beta < b(H)$, $f(H,\beta) < 0$. That means that, if $\beta < b(H)$, the contribution of this peak is exponentially small, while if $\beta > b(H)$ it is exponentially large. (For fixed $\beta$ and H, as S and L grow together, the contribution grows exponentially in L.)

A table of the critical values b(H) is given here:

| H | b(H)    | H | b(H)    |
|---|---------|---|---------|
| 3 | 0.88949 | 7 | 0.99865 |
| 4 | 0.96714 | 8 | 0.99951 |
| 5 | 0.98916 | 9 | 0.99982 |
| 6 | 0.99622 |   |         |

To summarize: Fix values of H and S, and select L (and thus $\beta$). If $\beta < b(H)$, the second maximum is exponentially small, and the sum is given by the first maximum, roughly $1 + S^2/2L^H$. Subtracting 1 (corresponding to $k=0$, which must be omitted from the sum), one finds that the probability of dependence among the rows of M is roughly $S^2/2L^H$. Remembering that $S = O(L)$ usually, and $H \geq 3$, it can be seen that there is a very small probability of dependence, thus a good probability (near 1) that M is of full rank and that the scheme will work.

On the other hand, if $\beta > b(H)$, the second maximum is exponentially large. Thus the expected number of linear relations is exponentially large. (This roughly means that the expected number of independent linear relations is linear in L.) Thus, with high probability, there is a linear relation among the rows of M, such that the corresponding relation among the rows of U is not satisfied. Thus with high probability the scheme will fail.

For fixed H and S, the probability of success of the scheme, as a function of $\beta$, is a sharp graph, almost a step function: near 1 for $\beta < b(H)$, and near 0 for $\beta > b(H)$. This relationship is shown in FIG. 6 for the case $H = 3$.

For a fixed application, S is known, as well as the name-value pairs $(N_i, V_i)$. If space is at a premium, one can select H to be 4 or 5, in order to achieve 96% to 99% efficiency. If computational costs are a consideration, one can select $H = 3$, to reduce computation while still achieving 89% efficiency.

Select L larger than $S/[H \cdot b(H)]$, in order to have a good chance that random hash functions will make the scheme work.

Choose H different easily implemented hash functions, and construct the matrix M (applying $HF_j$ to the names $N_i$). See whether the rows of M are linearly independent. If they are not, select different hash functions. If they are independent, form the matrix U, and invert M to find the matrix T. This matrix T is entered directly into storage (i.e. the H storage blocks of L words each).

We claim:

1. A method for generating error position indications for use with an error detection and correction scheme in which error syndromes are produced, characterized by hashing each error syndrome by a plurality of hashing functions, using the respective hash outputs to address a plurality of lookup tables, and logically combining the table outputs to generate an error pointer.

2. A method in accordance with claim 1, characterized in that each error syndrome is converted simultaneously by three hashing functions into three different hash outputs for addressing three lookup tables, and that the three table outputs are combined bitwise by an EXCLUSIVE-OR operation.

3. A method in accordance with claim 1 or 2, characterized in that by each of the individual hashing functions, a plurality of different vectors is generated each by arranging selected binary digits of the respective syndrome in a predetermined order, and that the resulting vectors are combined bitwise in a plurality of different logical operations.

4. A method in accordance with claim 1 or 2, characterized in that each syndrome, besides being subjected to a plurality of hashing operations, is used as an address for a lookup table in which for each possible syndrome a binary indication is stored, and that the respective binary table output indicates whether the syndrome represented a correctable or a non-correctable error.

5. A method in accordance with claim 3, characterized in that for at least one of the hashing functions three different vectors are generated of which two are combined by a logical AND or OR operation, the intermediate result being combined with the third vector by an EXCLUSIVE-OR operation.

6. A method in accordance with claim 3, characterized in that for at least one of the hashing functions, four different vectors are generated of which two are combined by a logical AND or OR operation, the respective first intermediate result being combined with a third one of the vectors by a logical OR or AND operation, and the second intermediate result being combined with the fourth vector by an EXCLUSIVE-OR operation.

7. A method in accordance with claim 1, characterized in that each of the error pointers generated by logically combining the plurality of table outputs comprises, apart from up to two coded error position representations, in predetermined bit positions a coded indication of the number of correctable errors and of the type of bit (data, ECC) that is corrected, or of the fact that at least one uncorrectable error is present.

8. A method in accordance with claim 1, characterized in that in the case of multiple errors within any one compact bit group of a plurality of such bit groups, an error pointer is generated which comprises in predetermined bit positions (a) an identification of the bit group in which a plurality of bits is to be corrected, (b) a bit mask indicating which bit positions in the identified group comprise an erroneous bit to be inverted, and (c) an indication that a multiple correctable error is present within one bit group.

9. Double error correcting apparatus including means for generating an error syndrome, characterized in that it comprises multiple hashing means connected to the syndrome generator for converting each syndrome to n different hash words, read-only storage means connected to the output of said multiple hashing means to provide n auxiliary words in response to n hash words, and EXCLUSIVE-OR means for logically combining said n auxiliary words into one error pointer.

10. Apparatus in accordance with claim 9, characterized in that second read-only storage means are provided which are connected to be addressable by the output of the syndrome generating means, and in which each addressable location is a single bit position whose contents indicates whether the addressing syndrome represents a correctable error condition or not.

11. Apparatus in accordance with claim 9, characterized in that decoding means are connected to receive the error pointer from said EXCLUSIVE-OR means, for decoding two separate fields of said error pointer into a direct position representation of erroneous bits to be inverted, and for decoding the remaining bit combination of said error pointer into an indication of the number of errors corrected.

12. Apparatus in accordance with claim 11, characterized in that said decoding means decodes the remaining bit combination of the error pointer into an indication that three or four correctable errors are present in one of plural 4-bit groups of the total information block, that it decodes one of the two fields of the error pointer as an identification of one of the 4-bit groups, and the second field as a mask indicating the three or four bits which are in error in the respective 4-bit group.

13. A method of converting names $N_i$ of a given list of names into associated values $V_i$ of a given list of values, characterized by converting a selected name by H different hashing functions into H different hash words, converting each of said H hash words by table lookup into an associated auxiliary value, and combining the resulting H auxiliary values by a given logical operation into the single value associated to said selected name.

* * * * *